(12) United States Patent
Bimberg et al.

(10) Patent No.: US 8,331,142 B2
(45) Date of Patent: Dec. 11, 2012

(54) MEMORY

(75) Inventors: Dieter Bimberg, Berlin (DE); Martin Geller, Essen (DE); Andreas Marent, Berlin (DE); Tobias Nowozin, Berlin (DE)

(73) Assignee: Technische Universitat Berlin, Berlin (DE)

(*) Notice: Subject to any disclaimer, the term of this patent is extended or adjusted under 35 U.S.C. 154(b) by 189 days.

(21) Appl. No.: 12/970,744

(22) Filed: Dec. 16, 2010

(65) Prior Publication Data

US 2012/0155165 A1    Jun. 21, 2012

(51) Int. Cl.
*G11C 11/34* (2006.01)
*H01L 29/68* (2006.01)

(52) U.S. Cl. .......... 365/184; 365/168; 257/14; 257/15; 257/18

(58) Field of Classification Search ............ 365/168, 365/184; 257/15, 18, E29.17, E29.168, E29.246
See application file for complete search history.

(56) References Cited

U.S. PATENT DOCUMENTS

| | | | |
|---|---|---|---|
| 6,281,519 B1 * | 8/2001 | Sugiyama et al. | 257/14 |
| 6,573,527 B1 * | 6/2003 | Sugiyama et al. | 257/14 |
| 6,696,313 B2 * | 2/2004 | Park et al. | 438/47 |
| 7,755,080 B2 * | 7/2010 | Song et al. | 257/22 |
| 2007/0151592 A1 * | 7/2007 | Forrest et al. | 136/243 |

FOREIGN PATENT DOCUMENTS

DE    10 2006 059 110 A1    6/2008

OTHER PUBLICATIONS

Balocco, C. et al, "Room-temperature operations of memory devices based on self-assembled InAs quantum dot structures", Applied Physics Letters, Dec. 13, 2004, vol. 85, No. 24, pp. 5911-5913.
Bimberg, D. et al. "Quantum Dot Heterostructures", John Wiley & Sons, Chichester, 1998.
Burr, G. W. et al., "Overview of candidate device technologies for storage-class memory", IBM J. Res. & Dev., Jul./Sep. 2008, vol. 52, No. 4/5, pp. 449-464.
Davies, J. H., "The Physics of Low-dimensional Semiconductors", Cambridge University Press, Cambridge, 1998.
Evolution of Parallel Computing, Intel Platforms 2006, http://www.intel.com/platforms/parallel.htm.
Finley, J. J. et al., "Electrical detection of optically induced charge storage in self-assembled InAs quantum dots", Applied Physics Letters, Nov. 2, 1998, vol. 73, No. 18, pp. 2618-2620.

(Continued)

*Primary Examiner* — Tan T. Nguyen
(74) *Attorney, Agent, or Firm* — Foley & Lardner LLP (57) ABSTRACT

An embodiment of the invention relates to a memory comprising a strained double-heterostructure having an inner semiconductor layer which is sandwiched between two outer semiconductor layers, wherein the lattice constant of the inner semiconductor layer differs from the lattice constants of the outer semiconductor layers, the resulting lattice strain in the double-heterostructure inducing the formation of at least one quantum dot inside the inner semiconductor layer, said at least one quantum dot being capable of storing charge carriers therein, and wherein, due to the lattice strain, the at least one quantum dot has an emission barrier of 1.15 eV or higher, and provides an energy state density of at least three energy states per 1000 nm$^3$, all said at least three energy states being located in an energy band of 50 meV or less.

18 Claims, 11 Drawing Sheets

OTHER PUBLICATIONS

Geller, M., et al. "450 meV hole localization in GaSb/GaAs quantum dots", Applied Physics Letters, Apr. 21, 2003, vol. 82, No. 16, pp. 2706-2708.

Geller, M., et al. "A write time of 6 ns for quantum dot-based memory structures", Applied Physics Letters, 2008, vol. 92, pp. 092108-1 to 092108-3.

Geller, M., et al. "Hole capture into self-organized InGaAs quantum dots", Applied Physics Letters, 2006, vol. 89, pp. 232105-1 to 232105-3.

Geller, M., et al. "Tunneling emission from self-organized In(Ga)As/GaAs quantum dots observed via time-resolved capacitance measurements", Physical Review B, 2006, vol. 73, pp. 205331-1 to 205331-8.

International Technology Roadmap for Semiconductors, Emerging Research Devices, Technical Report, Edition 2009.

Kapteyn, C.M., et al. "Many-particle effects in Ge quantum dots investigated by time-resolved capacitance spectroscopy", Applied Physics Letters, Dec. 18, 2000, vol. 77, No. 25, pp. 4169-4171.

Koike, K. et al. "Room-temperature operation of a memory-effect AlGaAs/GaAs heterojunction field-effect transistor with self-assembled InAs nanodots", Applied Physics Letters, Mar. 13, 2000, vol. 76, No. 11, pp. 1464-1466.

Marent, A. et al. "$10^6$ years extrapolated hole storage time in GaSb/AlAs quantum dots", Applied Physics Letters, 2007, vol. 91, pp. 242109-1 to 242109-3.

Marent, A., et al. "Carrier storage time of milliseconds at room temperature in self-organized quantum dots", Applied Physics Letters, 2006, vol. 89, pp. 072103-1 to 0723103-3.

Marent, A., et al. "Hole-based memory operation in an InAs/GaAs quantum dot heterostructure" Applied Physics Letters, 2009, vol. 95, pp. 242114-1 to 242114-3.

Müller, C. R. et al. "Room temperature memory operation of a single InAs quantum dot layer in a GaAs/AlGaAs heterostructure", Applied Physics Letters, 2008, vol. 93, pp. 063502-1 to 063502-3.

Müller, T., et al. "Ultrafast intraband spectroscopy of electron capture and relaxation in InAs/GaAs quantum dots", Applied Physics Letters, Oct. 27, 2003, vol. 83, No. 17, pp. 3572-3574.

Nataraj, D. et al. "Fabrication of one-dimensional GaAs channel-coupled InAs quantum dot memory device by selective-area metal-organic vapor phase epitaxy", Applied Physics Letters, 2005, vol. 87, pp. 193103-1 to 193103-3.

Nowozin, T. et al. "Temperature and electric field dependence of the carrier emission processes in a quantum dot-based memory structure", Applied Physics Letters, 2009, vol. 94, pp. 042108-1 to 042108-3.

Pavan, P. et al., "Flash Memory Cells—An Overview", Proceedings of the IEEE, Aug. 1997, vol. 85, No. 8, pp. 1248-1271.

Pettersson, H. et al. "Case study of an InAs quantum dot memory: Optical storing and deletion of charge", Applied Physics Letters, Jul. 2, 2001, vol. 79, No. 1, pp. 78-80.

Schliwa, A. et al., "Few-particle energies versus geometry and composition of $In_xGa_{1-x}As$/GaAs self-organized quantum dots", Physical Review B, 2009, vol. 49, pp. 075443-1 to 075443-14.

Stier, O. et al., "Electronic and optical properties of strained quantum dots modeled by 8-band k•p theory", Physical Review B, Feb. 15, 1999, vol. 59, No. 8, pp. 5688-5701.

Waser, R. "Nanoelectronics and Information Technology", Wiley-VCH, Weinheim, Berlin, 2003.

International Search Report and Written Opinion in PCT/EP2011/072181 dated Mar. 26, 2012.

Marent A., et al. "The QD-Flash: a quantum dot-based memory device", Semiconductor Science and Technology, Dec. 9, 2010, vol. 26, No. 1, p. 14026 (7pp).

* cited by examiner

MEMORY

The present invention relates to memories, and more particularly to semiconductor memories.

BACKGROUND OF THE INVENTION

Distinct types of memories will combine the advantages of nonvolatility of the Flash-memory [1] and the performance and endurance of the dynamic random access memory (DRAM) [2]. A large variety of such memory concepts has been proposed using different approaches, like FeRAM, MRAM, PCRAM, etc. [3]. One of the most promising options for chargebased memories is based on self-organized quantum dots (QDs) as memory units. Memory operation for III-V QD structures has been demonstrated, either based on optically [4-6] or electrically controlled charge storage [7-9].

OBJECTIVE OF THE PRESENT INVENTION

An objective of the present invention is to provide a memory which provides a long storage time in combination with fast write and erase time and high endurance.

BRIEF SUMMARY OF THE INVENTION

An embodiment of the invention relates to a memory comprising a strained double-heterostructure having an inner semiconductor layer which is sandwiched between two outer semiconductor layers. The lattice constant of the inner semiconductor layer differs from the lattice constants of the outer semiconductor layers, the resulting lattice strain in the double-heterostructure inducing the formation of at least one quantum dot inside the inner semiconductor layer. Said at least one quantum dot is capable of storing charge carriers therein. Due to the lattice strain, the at least one quantum dot has an emission barrier of 1.15 eV or higher, and provides an energy state density of at least three energy states per 1000 $nm^3$, all said at least three energy states being located in an energy band of 50 meV or less.

Preferably, each of said at least three energy states is capable of storing two charge carriers.

Each of said at least three energy states preferably stores holes and is capable of storing two holes. Energy states of confined holes are more closely spaced than those of electrons, and thus show a much higher carrier density in terms of their energy distribution than electrons. As such, energy states for holes can store more carriers per unit volume than energy states for electrons. A larger number of stored carriers per binary information unit increase the reliability of the stored information.

According to a preferred embodiment, said at least three energy states are energetically located above the Fermi-level if the strained double-heterostructure is unbiased.

The memory preferably comprises a 2-dimensional hole gas layer capable of transporting holes for charging or discharging the at least one quantum dot.

According to a very preferred embodiment, a semiconductor superlattice is arranged between said 2-dimensional hole gas layer and the at least one quantum dot.

Said semiconductor superlattice may comprise at least two quantum wells, each of which providing at least one energy state.

The hole-energy states of the two quantum wells may be located above the Fermi-level if the strained double-heterostructure is unbiased.

The energetic positions of the energy states of the least two quantum wells preferably differ from another if the strained double-heterostructure is unbiased.

The energy states of the at least two quantum wells can preferably be shifted relative to each other and relative to the energy states of the at least one quantum dot by applying an external bias voltage to the strained double-heterostructure.

By applying an erase voltage to the strained double-heterostructure, the energy states of the at least two quantum wells may be aligned such that holes can tunnel from the at least one quantum dot through the semiconductor superlattice based on resonance tunneling. In an unbiased state, the energy levels of the at least two quantum wells may mismatch and resonance tunneling of holes may be disabled. With this embodiment just a very small erase voltage is needed to switch from the storage situation to the erase situation. The electric field is only increased marginally leading to a high endurance of the memory cell.

The 2-dimensional hole gas layer may be part of a field effect transistor of the memory, the gate electrode of said field effect transistor allowing to apply a voltage to the strained double-heterostructure.

An intermediate layer may be arranged between the gate electrode of the field effect transistor and the strained double-heterostructure, said intermediate layer having a smaller band gap than the adjacent outer semiconductor layer of the strained double-heterostructure.

A conduction band discontinuity may be positioned at the interface between the intermediate layer and the adjacent outer semiconductor layer. Such a conduction band discontinuity may prevent electrons from reaching the strained double-heterostructure when the strained double-heterostructure is biased.

The gate contact of the field effect transistor may be an ohmic contact, and the intermediate layer may be n-doped.

Alternatively, the gate contact of the field effect transistor may be a Schottky contact.

The inner semiconductor layer and the two outer semiconductor layers may consist of Ga(As,Sb) and (Al,Ga)As, respectively, or of Ga(As,Sb) and GaP, respectively.

The quantum dots in the inner semiconductor layer may be arranged in an array.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures. Understanding that these figures depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout. It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

The embodiments described below may be based on III-V quantum dots (QD) which allow the storage of holes. Hole storage offers significant advantages with respect to scalability and storage time. The energy levels of confined holes in a QD are much more closely spaced than those of electrons due to their larger effective mass. Thus, at least one order of magnitude more holes can be stored in a given volume than electrons. In addition, hole-confining type-II systems (e.g., GaSb/AlGaAs QDs) provide huge hole localization energies leading to storage times of more than ten years at room temperature, a basic prerequisite for a nonvolatile memory.

Figure 11:
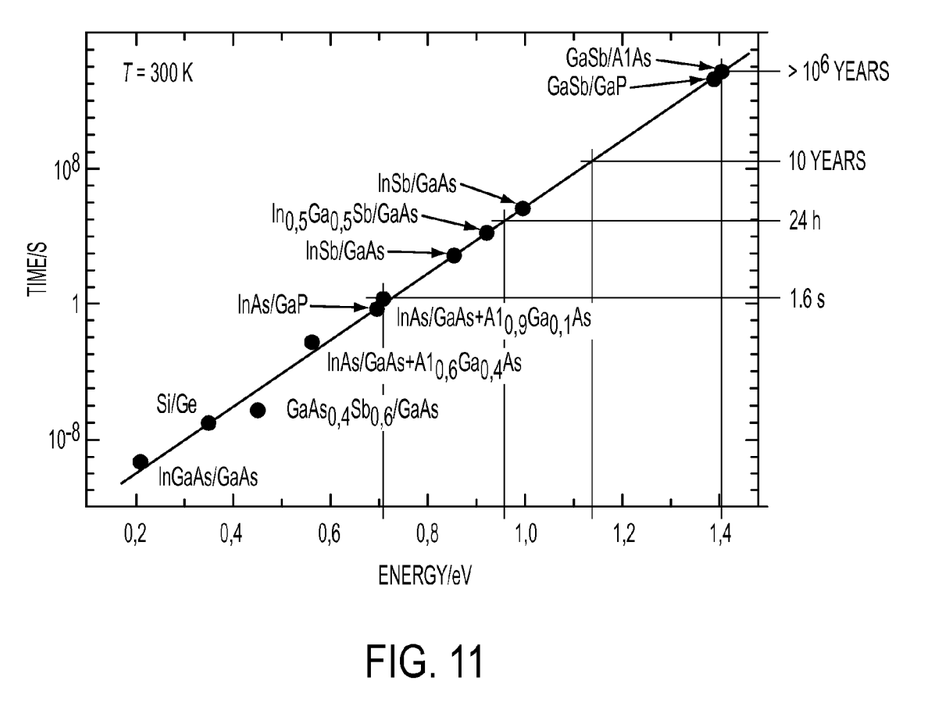
FIG. 11 shows achievable storage times for various material systems.

The localization energies and therefore the emission barriers for confined holes in the ground state of the QD are summarized in FIG. 11 for different III-V QDs [10]. The storage time shows an exponential dependence on the localization energy as predicted by the common rate equation of thermally activated emission. The storage time increases by one order of magnitude for an increase of the localization energy of about 50 meV. It can be seen that memories based on Ga(As,Sb)/(Al,Ga)As and Ga(As,Sb)/GaP may reach storage times above 10 years.

A first exemplary embodiment of the present invention relates to an InAs/GaAs QD memory which uses holes as charge carriers instead of electrons. For monitoring, the commonly used electron channel is replaced by a 2D hole gas (2DHG) embedded underneath the QD layer. Static and time-resolved measurements of storage, write, and erase times demonstrate the feasibility of the hole-based QD-memory concept.

Figure 1:
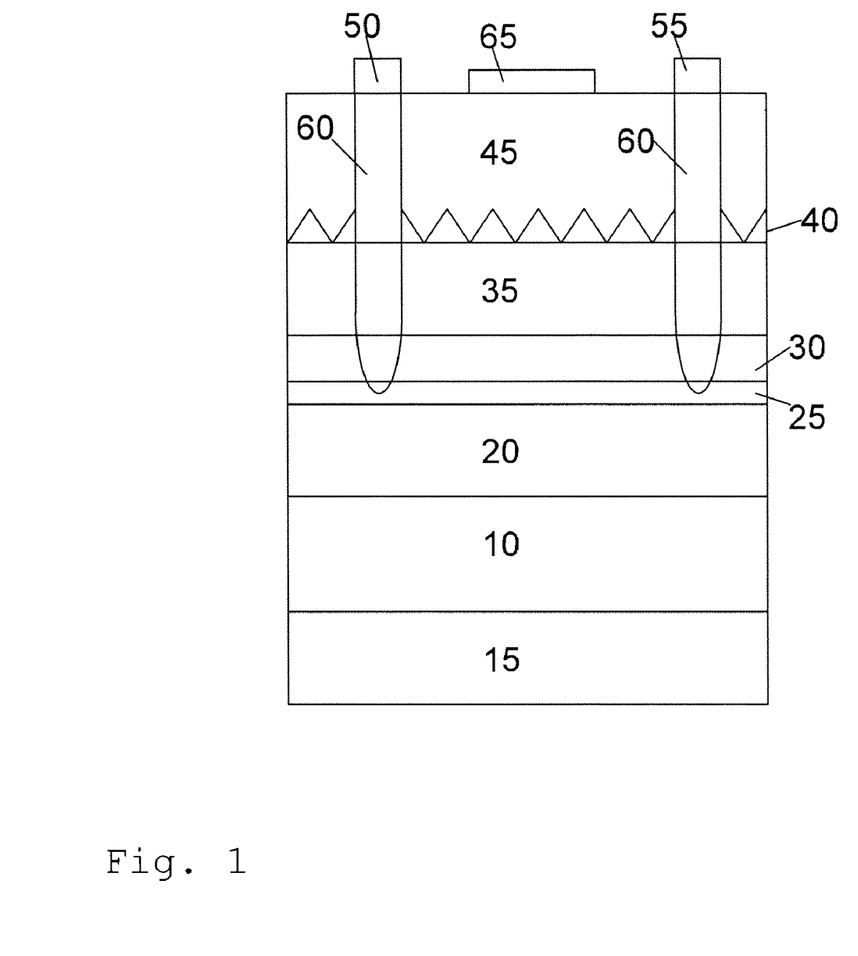
FIG. 1 shows a first embodiment of a memory according to the invention.

The exemplary embodiment of FIG. 1 consists of a quantum-well modulation doped field-effect transistor with a single InAs/GaAs QD layer in close vicinity to the 2DHG. A schematic cross section of the layer structure is shown in FIG. 1. A 1 μm thick undoped GaAs buffer layer 10 was grown first on an undoped GaAs substrate 15. The 2DHG was formed with 40 nm p-doped (p=$2*10^{18}$ cm$^{-3}$) GaAs layer 20, a 7 nm thick undoped GaAs spacer layer 25, and a 8 nm thick In$_{0.25}$Ga$_{0.75}$As quantum well 30. Subsequently, a 20 nm undoped GaAs layer 35 was deposited, followed by a single InAs QD layer 40 (nominally ~1.8 mL). Finally, the structure was completed by a 180 nm undoped GaAs cap 45.

The heterostructure was processed into Hall bars with an active area of 310*460 μm$^2$ using chemical wet etching (see FIG. 1 (b)).

The source and drain areas 50, 55 were metallized using a Ni/Zn/Au alloy which was annealed at 400° C. for 3 minutes to form ohmic contacts 60 down to the 2DHG. The gate 65 was formed by Ni/Au as a Schottky contact. Hall measurements at gate electrode 70 yielded a charge carrier density and a mobility of the 2DHG at 77 K of $8*10^{11}$ cm$^{-2}$ and 4350 cm$^2$/Vs, respectively.

Figure 2:
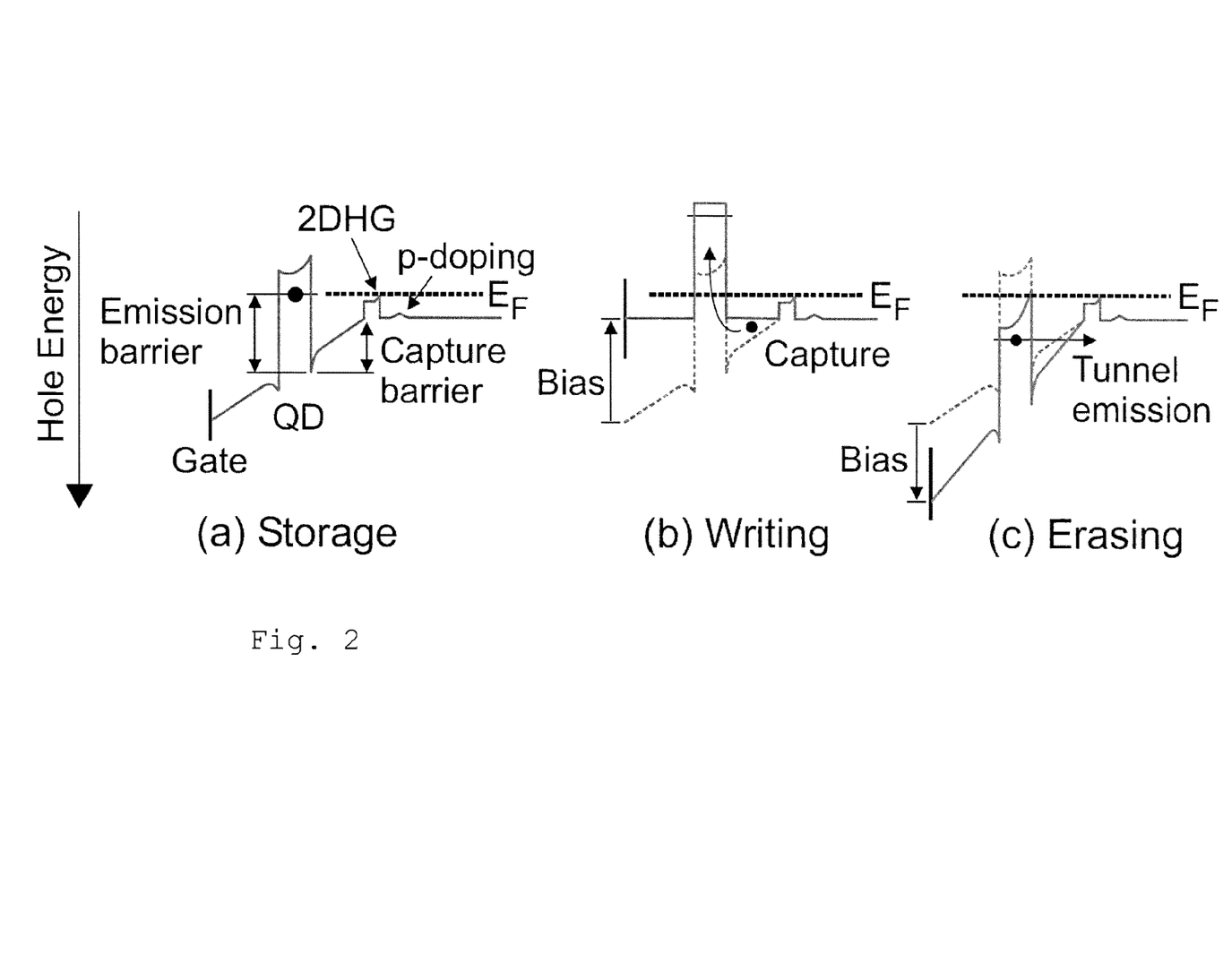
FIG. 2 shows a schematic illustration of the storage (a), write (b), and erase (c) operations in the embodiment of FIG. 1.

FIG. 2 schematically shows the valence band of the structure for the three memory operations: storage, writing, and erasing. At the storage position (FIG. 2(a)), the binding potential of holes in the QDs represents the emission barrier, needed to store a logical "1". To store a logical "0" (defined as empty QDs) a capture barrier is necessary, which is formed by the band-bending of the Schottky contact.

The storage time for both logic states is limited by the emission and capture processes of the QDs. In the structure, thermally assisted tunneling across the emission and capture barriers initiates the discharging and charging processes. The emission and capture rates depend on the barrier height (i.e., localization energy and capture barrier height), the temperature, and the electric field. To write a logical "1" (FIG. 2(b)), a negative bias is applied to the gate. This completely eliminates the capture barrier formed by the band-bending and fast write times down to nanoseconds can be realized. Thus, the QD-memory concept solves the drawbacks of Flash's SiO$_2$ barriers by using a large barrier height which can, however, be decreased to almost zero during write operation. Write times similar to those of DRAMs or even shorter are possible.

To erase the information (FIG. 2(c)) the electric field at the position of the QDs is increased by applying a positive bias such that tunnel emission occurs. The read-out of the stored information is done via the 2DHG below the QD layer. Carriers stored in the QDs reduce the charge density and the mobility in the 2DHG resulting in a lower conductance of the 2DHG when the QDs are occupied. To investigate the influence of holes stored in the QDs on the conductance of the 2DHG, the drain current $I_D$ versus gate voltage $V_G$ was measured in the dark with a fixed drain-source voltage of 100 mV.

Figure 3:
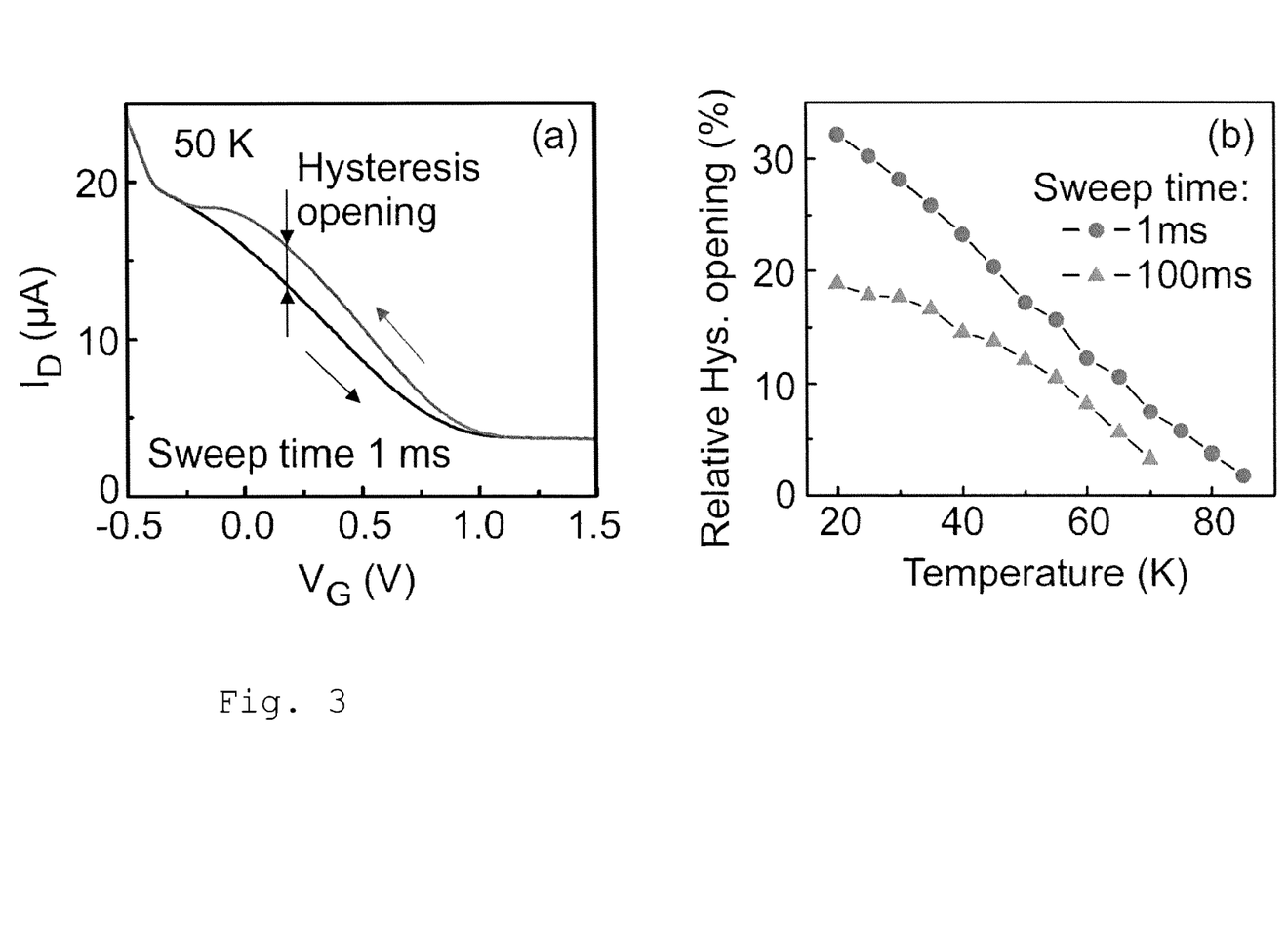
FIG. 3 shows (a) hysteresis at 50 K, and (b) temperature dependence of the hysteresis opening for a sweep time of 1 and 100 ms, respectively.

FIG. 3(a) shows the measured hysteresis at a temperature of 50 K. The measurement cycle starts with a 10 ms long charging pulse ($V_G$=-1 V), which shifts the QD states below the Fermi level, charging them with holes from the 2DHG (see FIG. 2(b)).

When the gate voltage is now swept to 1.5 V the drain current decreases until the 2DHG is pinched off at about 1.1 V. During the down sweep the QDs remain occupied if the sweep time is shorter than the hole storage time in the QDs.

At $V_G$=1.5 V the QD states are far above the Fermi level (see FIG. 2(c)) and tunnel emission discharges the QDs. When the gate voltage is swept back to -1 V a larger current is observed leading to a distinct hysteresis opening. The hysteresis originates from the influence of holes stored in the QDs on the conductance of the 2DHG during the down sweep.

The charged QDs act as Coulomb scattering centers, reducing the mobility of the 2DHG. In addition, using Gauss' law it was predicted that the transfer of holes in QDs lead to a reduction in the carrier density in the 2DHG. Both the lowered charge carrier density and the decreased mobility reduce the conductance during the down sweep, resulting in a lower current trace compared to the up sweep. The maximum hysteresis opening with respect to the up sweep is shown in FIG.

3(*b*) as a function of temperature for two different sweep times. Using a sweep time of 1 ms, the hysteresis opening drops from 32% at 20 K to almost zero at 85 K. The descent has its origin in the reduced charge carrier storage time of QDs with increasing temperature, i.e., at higher temperatures more holes are emitted during the down sweep.

In [7] a high temperature memory effect due to deep levels is reported for a different InAs QD-structure. Here, the absence of such high temperature memory effects proves that not deep levels but in fact the QDs act as memory units. This conclusion is confirmed by previous investigations of hole emission from similar InAs/GaAs QDs by deep level transient spectroscopy, which resulted in a thermal emission time constant of 5 ms at 90 K for the QD hole ground state, in agreement with the disappearance of the hysteresis at 85 K for a sweep time of 1 ms. A sweep time of 100 ms further reduces the hysteresis opening as compared to 1 ms, since more holes, stored in the QDs, are emitted during the slower down sweep.

An increased maximum hysteresis opening is expected using larger QD densities and/or multiple QD layers. The memory operation of the QD-memory prototype is studied by time-resolved measurements of the drain current at different storage voltages $V_{St}$, with either initially occupied or empty QDs. The QDs are charged or discharged by applying a gate voltage of −0.8 or 2 V, respectively.

After this initialization of the logical "1" or "0", the gate voltage was abruptly changed to the storage voltage and the drain current was measured as a function of time.

Figure 4:
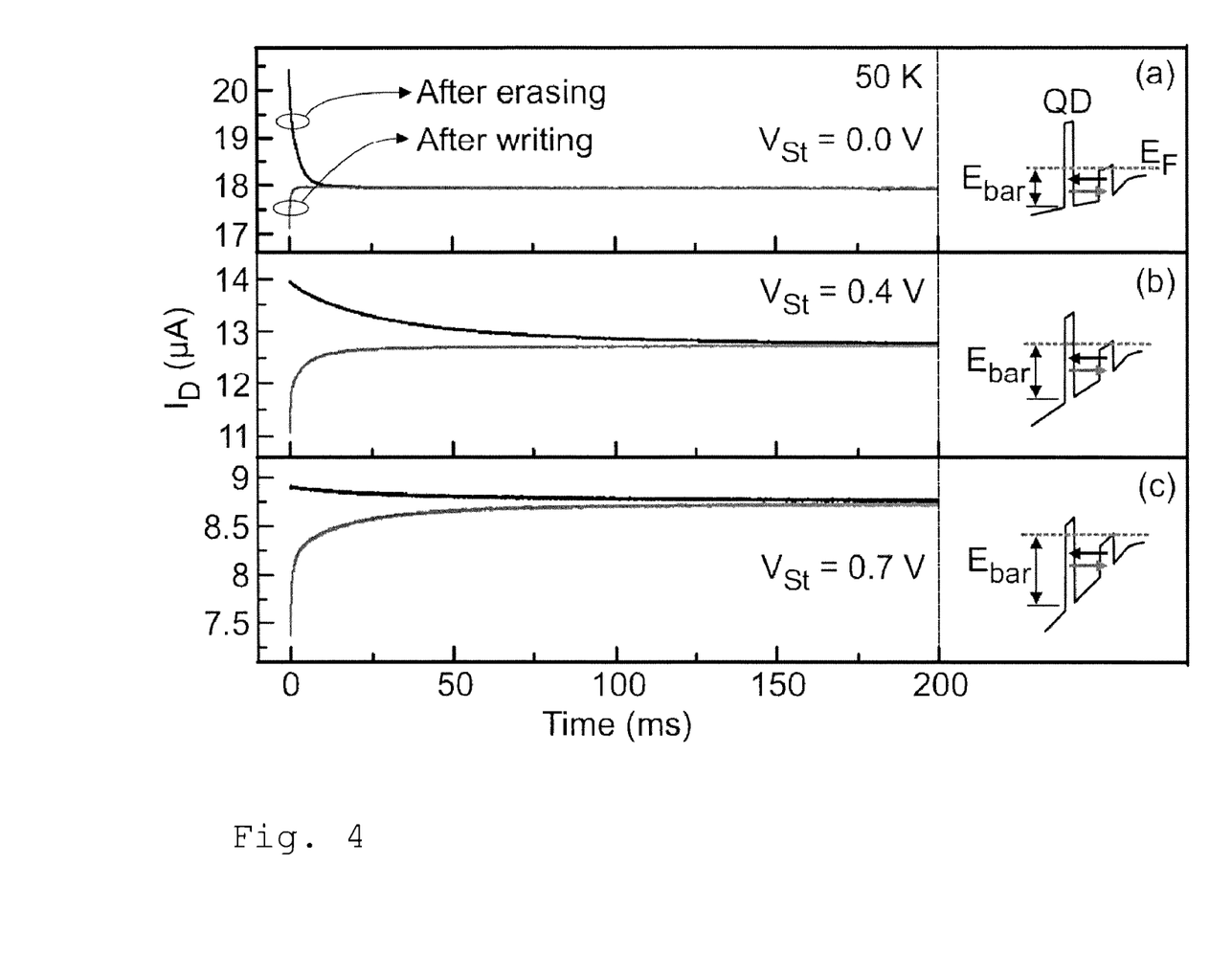
FIG. 4 shows drain current transients at 50 K at a storage voltage of 0 V (a), 0.4 V (b), and 0.7 V (c), wherein insets show the valence band profiles at the given voltages.

FIG. 4 shows the transients at 50 K for three different storage voltages (0, 0.4, and 0.7 V). The upper transients represent hole capture into initially empty QDs, leading to a decrease in the conductance of the 2DHG and, hence, to a decrease in the drain current. The lower transients represent hole emission out of fully occupied QDs and, thus, the drain current increases to the equilibrium state. A change of the storage voltage from 0 to 0.4 V and further to 0.7 V causes multiple effects (FIGS. 4(*a*)-4(*c*)); the time constants of both transients increase, the amplitude of the capture transient is reduced, and the amplitude of the emission transient is increased. These effects can be explained by the changes of the capture and emission processes when applying a positive storage voltage to the structure.

On the right hand side of FIGS. 4(*a*)-4(*c*) the valence band profiles for the three storage voltages are shown. The amplitudes of the transients represent the amount of transferred holes and are correlated with the number of levels which are below the Fermi level (for capture) and above the Fermi level (for emission). A larger positive storage voltage shifts the Fermi level toward the QD ground state and, hence, more holes are emitted, less holes are captured, and thus the amplitudes vary.

The prolongation of the time constants is also related to the Fermi level shift as it leads to an increased capture and emission barrier height ($E_{bar}$ in FIG. 4).

The write and erase times of the memory structure were measured. To determine write and erase times, a method was used which allowed to study emission from or capture into QDs across an enlarged span of time constants. The hysteresis opening at a storage position of 0.4 V was measured after applying write/erase pulses with successively reduced pulse widths down to 10 ns. When the pulse width was too short for any charging/discharging of the QDs, the hysteresis opening vanished. The write/erase times were defined as the pulse width, at which the hysteresis opening drops to 50% of the maximum value.

Figure 5:
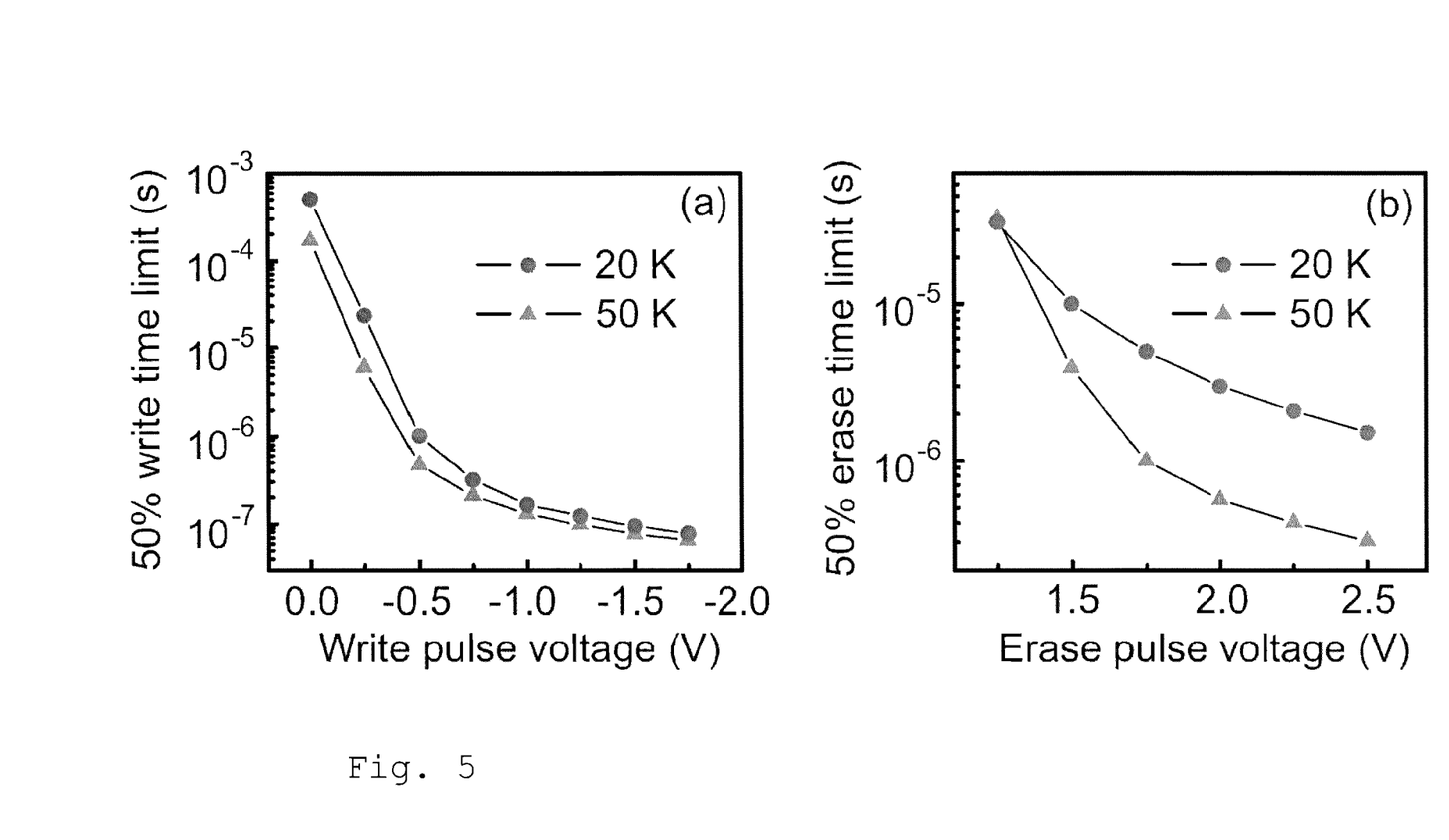
FIG. 5 shows write times (a) and erase times (b) in dependence on the pulse voltage.

FIG. 5(*a*) shows the write time in dependence on the write pulse voltage at 20 and 50 K. A more negative write pulse leads to a reduction in the capture barrier during writing and, hence, the write time decreases exponentially. For write pulses larger than |0.5| V the write time starts to saturate and reaches a minimum at 80 ns for a write pulse of −1.75 V.

This saturation has presently its origin in a parasitic cut-off frequency of about 2 MHz of the RC low pass of our present devices. Much faster write times are expected for smaller devices having larger parasitic cut-off frequencies.

The erase times are shown in FIG. 5(*b*). A minimum erase time of 350 ns at 50 K was obtained for an erase pulse of 2.5 V. The temperature dependence of the write and erase times reflects again the increased thermal capture and emission rates at higher temperatures.

Summarizing, the first exemplary embodiment relates to a hole based memory device using InAs/GaAs QDs for charge carrier storage. Charging and discharging of the QDs are clearly controlled by a gate voltage. The read-out of the stored information uses a 2DHG, with a relative hysteresis opening up to 32%. Write times down to 80 ns—only a factor of 8 larger than for a typical DRAM—and erase times of 350 ns—four orders of magnitude faster than for a typical Flash memories—were demonstrated. The results support the assumption that the QDs act as memory.

A second exemplary embodiment of the present invention will be explained in further detail with reference to FIGS. 6-8.

Figure 6:
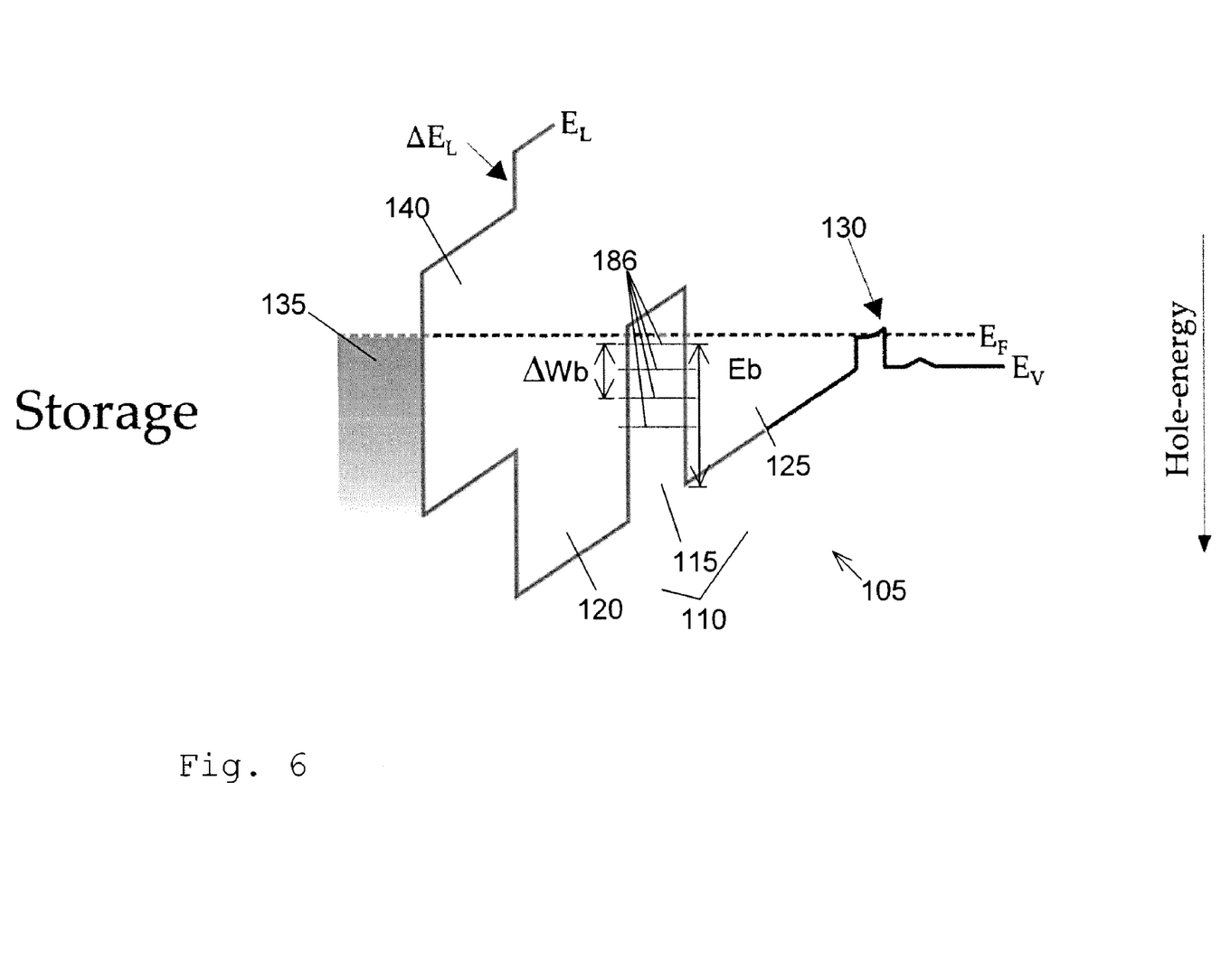
FIG. 6 shows a second embodiment of a memory according to the invention in an unbiased state.

FIG. 6 shows a memory 105 comprising a strained double-heterostructure 110 having an inner semiconductor layer 115 which may consist of Ga(As,Sb) and which is sandwiched between two outer semiconductor layers 120 and 125. The outer semiconductor layers 120 and 125 may consist of (Al, Ga)As.

The lattice constant of the inner semiconductor layer 115 differs from the lattice constants of the outer semiconductor layers 120 and 125, such that lattice strain is generated. The resulting lattice strain in the double-heterostructure 110 induces the formation of at least one quantum dot inside the inner semiconductor layer, said at least one quantum dot providing at least three energy states 186 capable of storing charge carriers therein.

Due to the lattice strain, the at least one quantum dot has an emission barrier Eb of 1.15 eV or higher, and provides an energy state density of at least three energy states per 1000 nm$^3$. All of the at least three energy states are located in an energy band $\Delta Wb$ of 50 meV or less. The energy band $\Delta Wb$ is provided such that each of said at least three energy states is capable of storing two holes.

FIG. 6 shows the memory 105 in an unbiased state. It can be seen that the at least three energy levels of holes are energetically above than the Fermi-level Ef.

Moreover, FIG. 6 shows a 2-dimensional hole gas layer 130 which is capable of transporting holes for charging or discharging the at least one quantum dot. The 2-dimensional hole gas layer 130 is part of a field effect transistor of the memory. The gate electrode 135 of the field effect transistor allows applying a voltage to the strained double-heterostructure 110.

The memory of FIG. 6 further comprises an intermediate layer 140 which is arranged between the gate electrode 135 of the field effect transistor and the strained double-heterostructure 110. The intermediate layer 140 has a smaller band gap than the adjacent outer semiconductor layer 120 of the strained double-heterostructure 110. The smaller band gap provides a conduction band discontinuity $\Delta E_L$ at the interface between the intermediate layer 140 and the adjacent outer semiconductor layer 120. The conduction band discontinuity $\Delta E_L$ prevents electrons originating from gate 135 to get into the outer semiconductor layer 120 if a positive bias voltage is applied. Thus, the conduction band discontinuity $\Delta E_L$ avoids recombination of electrons and holes in the inner semiconductor layer 115.

The gate contact of the field effect transistor is preferably an ohmic contact, and the intermediate layer 140 is preferably n-doped.

Figure 7:
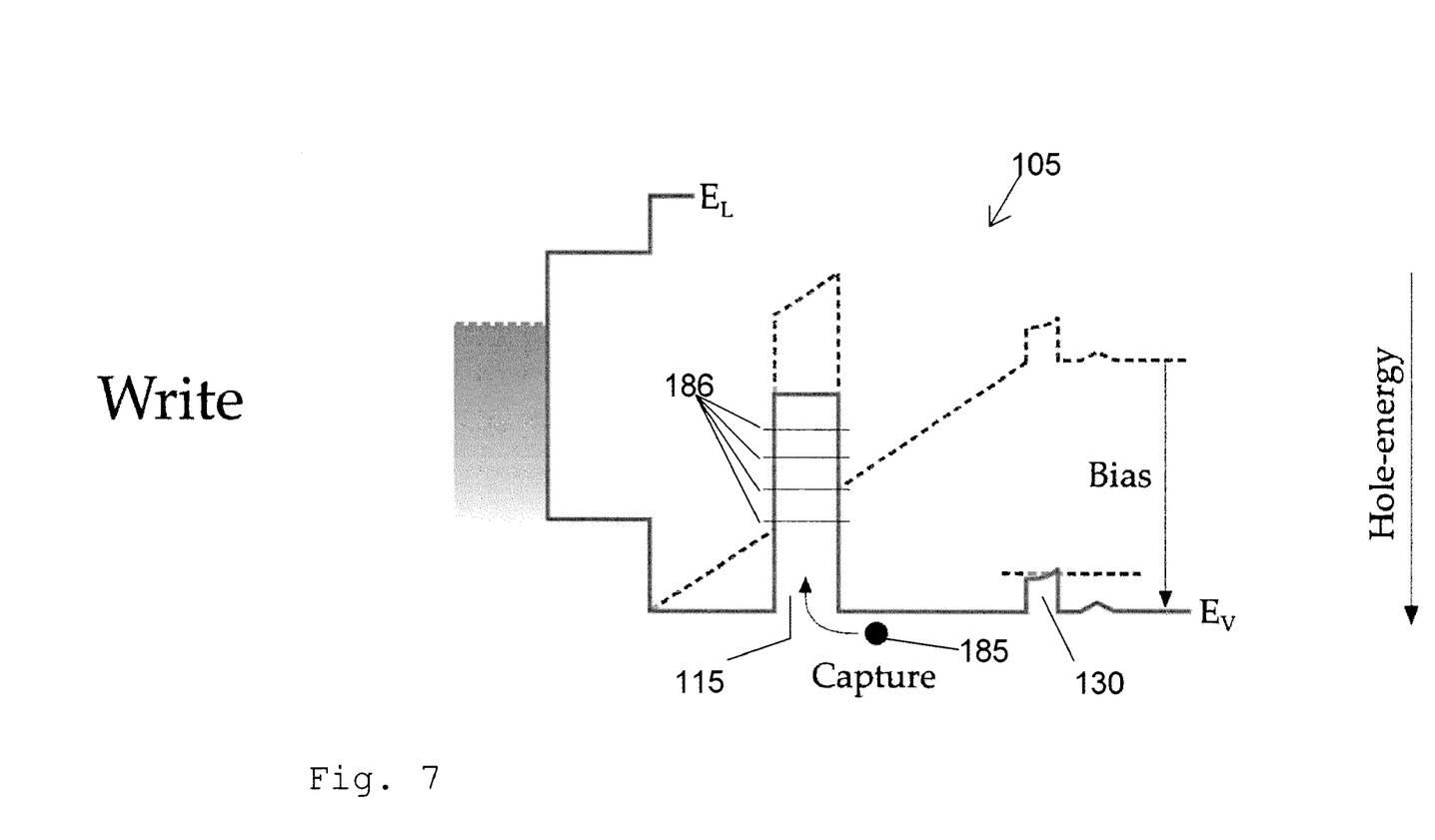
FIG. 7 shows the second embodiment during write operation.

FIG. 7 shows the memory 105 of FIG. 6 after applying a write-voltage to the strained double-heterostructure. It can be seen that holes 185 may leave the 2-dimensional hole gas layer 130 and drop into the energy states 186 of the quantum dot located in the inner semiconductor layer 115.

Figure 8:
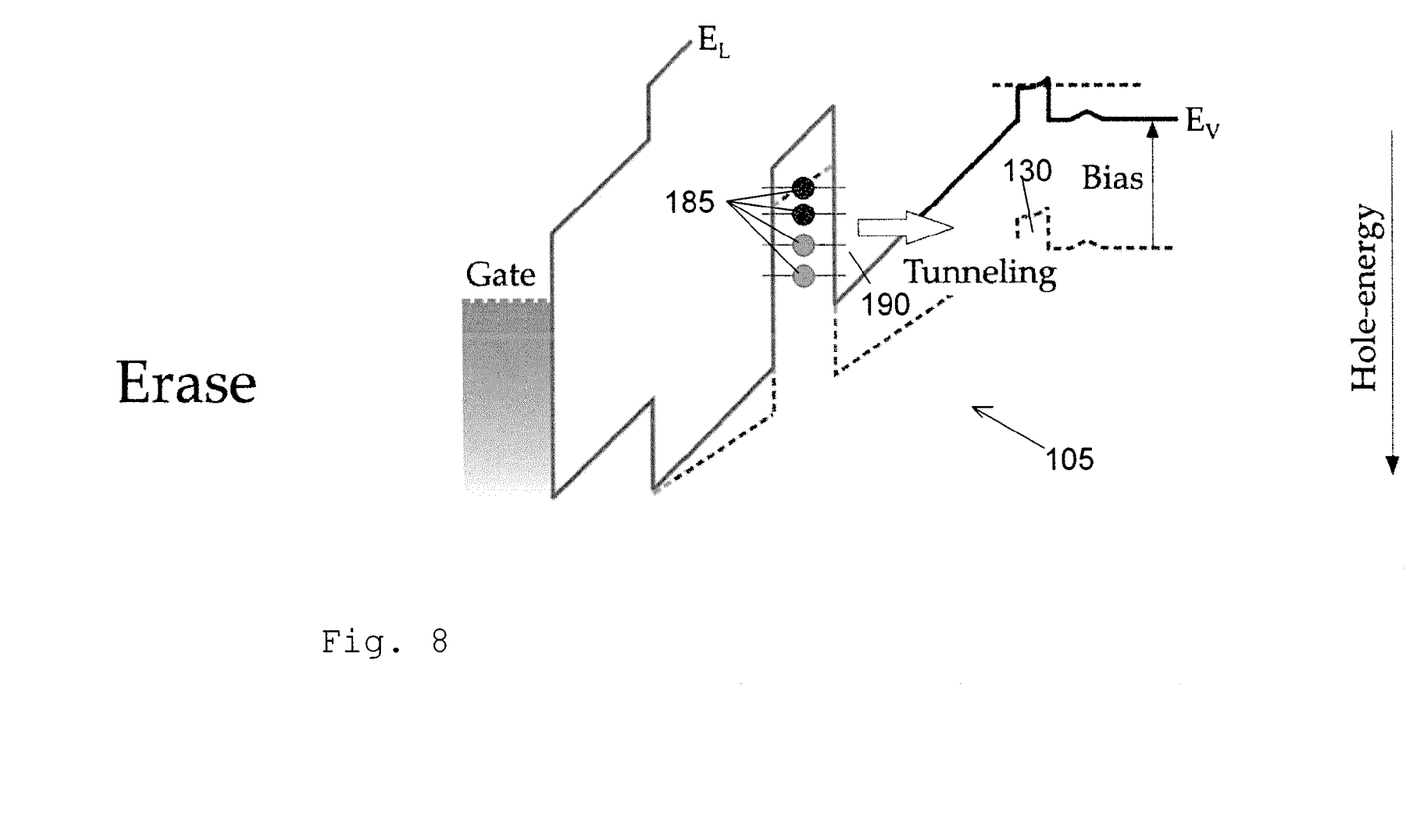
FIG. 8 shows the second embodiment during erase operation.

FIG. 8 shows the memory 105 after applying an erase-voltage to the strained double-heterostructure. It can be seen that the holes 185 stored in the energy states of the quantum dot may tunnel through the energy barrier 190 and reach the 2-dimensional hole gas layer 130.

A third exemplary embodiment of the present invention will be explained in further detail with reference to FIGS. 9-10.

Figure 9:
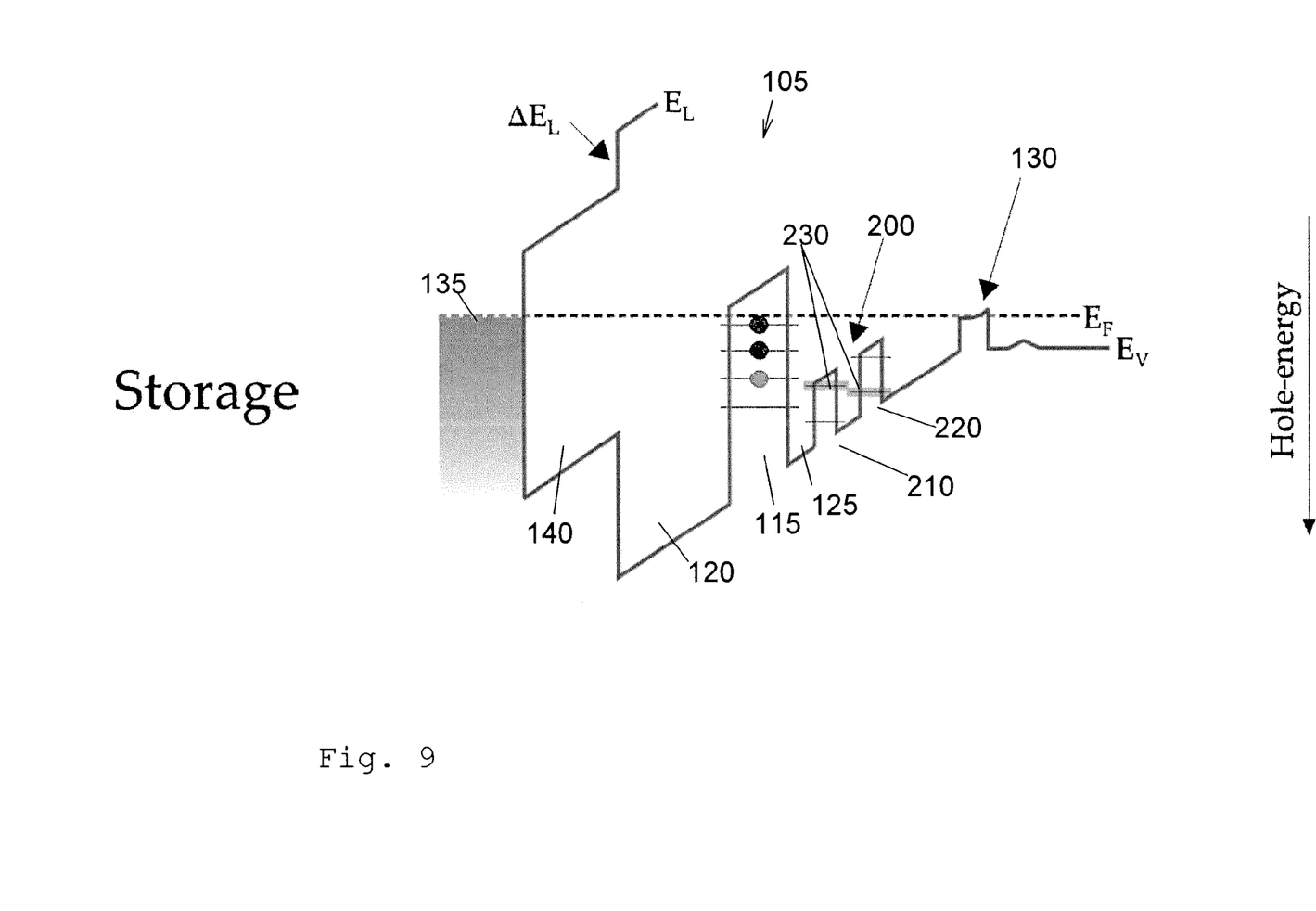
FIG. 9 shows a third embodiment of a memory according to the invention in an unbiased state.

FIG. 9 shows a memory 105 which comprises a strained double-heterostructure 110 having an inner semiconductor layer 115 which is sandwiched between two outer semiconductor layers 120 and 125. An intermediate layer 140 is arranged between a gate electrode 135 and the outer semiconductor layer 120. Furthermore, the memory 105 comprises a 2-dimensional hole gas layer 130 which is capable of transporting holes for charging or discharging at least one quantum dot positioned in the inner semiconductor layer 115. Insofar, the third exemplary embodiment corresponds to the second exemplary embodiment described with respect to FIGS. 6-8.

In addition to the second embodiment, the third embodiment comprises a semiconductor superlattice 200 which is arranged between the 2-dimensional hole gas layer 130 and the outer semiconductor layer 125. The semiconductor superlattice 200 comprises two quantum wells 210 and 220. Each quantum well 210 and 220 provides at least one energy state 230.

In FIG. 9, the strained double-heterostructure 110 is unbiased. It can be seen that the energetic positions of the energy states 230 of the quantum wells 210 and 220 differ from another. Due to the mismatch of the energy states 230, the holes trapped in the energy states in the quantum dot cannot tunnel through the semiconductor superlattice 200 and thus not reach the 2-dimensional hole gas layer 130.

Figure 10:
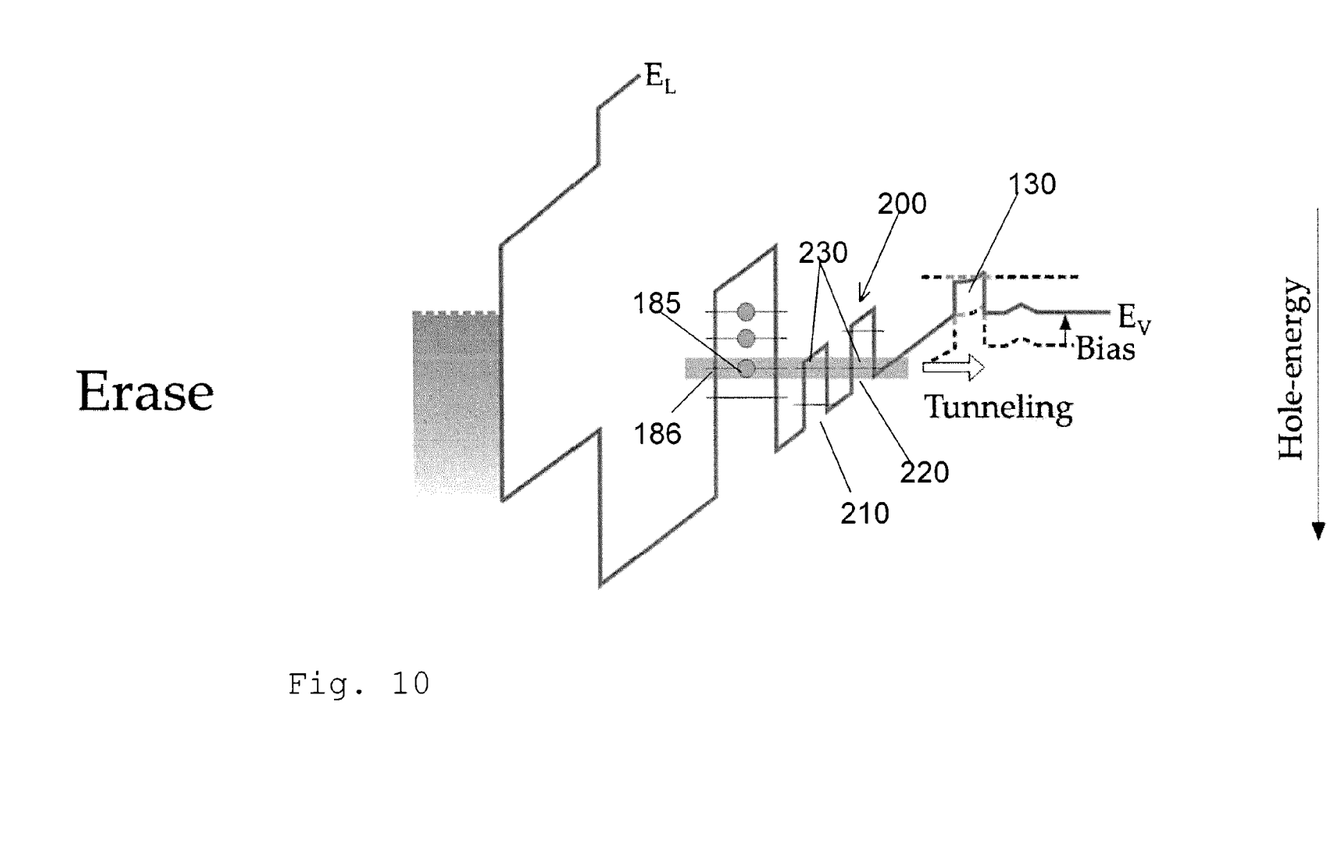
FIG. 10 shows the third embodiment during erase operation.

FIG. 10 shows the third embodiment after applying an external erase bias voltage to the strained double-heterostructure. Due to the bias voltage, the energy states 230 of the quantum wells 210 and 220 are shifted relative to each other and relative to the energy states 186 of the at least one quantum dot. This alignment enables the holes 185 to tunnel from the quantum dot through the semiconductor superlattice 200 based on resonant tunneling. The holes can reach the 2-dimensional hole gas layer 130 and the energy states of the at least one quantum dot are emptied.

In the first and second embodiment, the erase process is based on hole tunneling through the entire emission barrier. Hence, the erase time depends on the height of the emission barrier. Regarding an emission barrier of 1.15 eV or higher, high electric fields in the range of MV/cm are needed to reach fast erase times [11]. This high electric fields lead to a high power consumption of the memory cell and to a low endurance, as defects in the lattice could be generated. The third embodiment solves these problems. There, the erase process is done by resonant tunneling through the superlattice. Only a small voltage is needed to align the energy states of the quantum well to allow resonant hole tunneling. As a consequence the electric field is increased just marginally. Therewith, both problems—the high power consumption and the low endurance—are solved. A memory with long storage time in combination with a fast erase time and high endurance is feasible.

FIG. 11 shows achievable storage times for various material systems. It can be seen that memories based on Ga(As, Sb)/(Al,Ga)As and Ga(As,Sb)/GaP may reach storage times above 10 years.

Literature

[1] P. Pavan, R. Bez, P. Olivo, and E. Zanoni, Proc. IEEE 85, 1248 (1997).

[2] R. Waser, Nanoelectronics and Information Technology Wiley, Weinheim, 2003.

[3] G. W. Burr, B. N. Kurdi, J. C. Scott, C. H. Lam, K. Gopalakrishnan, and R. S. Shenoy, IBM J. Res. Dev. 52, 449 (2008).

[4] J. J. Finley, M. Skalitz, M. Arzberger, A. Zrenner, G. Böhm, and G. Abstreiter, Appl. Phys. Lett. 73, 2618__1998.

[5] K. Koike, K. Saitoh, S. Li, S. Sasa, M. Inoue, and M. Yano, Appl. Phys. Lett. 76, 1464 (2000).

[6] H. Pettersson, L. Baath, N. Carlson, W. Seifert, and L. Samuelson, Appl. Phys. Lett. 79, 78 (2001).

[7] C. Balocco, A. M. Song, and M. Missous, Appl. Phys. Lett. 85, 5911 (2004).

[8] D. Nataraj, N. Ooike, J. Motohisa, and T. Fukui, Appl. Phys. Lett. 87, 193103 (2005).

[9] C. R. Müller, L. Worschech, J. Heinrich, S. Höfling, and A. Forchel, Appl. Phys. Lett. 93, 063502 (2008).

[10] A. Marent, M. Geller, A. Schliwa, D. Feise, K. Pötschke, and D. Bimberg, N. Akçay and N. Öncan, Appl. Phys. Lett. 91, 242109 (2007).

[11] T. Nowozin, A. Marent, M. Geller, N. Akçay, N. Öncan, D. Bimberg, Appl. Phys. Lett. 94, 4, 042108 (2009)

Reference Signs

10 buffer layer
15 substrate
20 layer
25 spacer layer
30 quantum well
35 layer
40 QD layer
45 cap
50 source
55 drain
60 ohmic contact
65 gate
105 memory
110 strained double-heterostructure
115 inner semiconductor layer
120 outer semiconductor layer
125 outer semiconductor layer
130 2-dimensional hole gas layer
135 gate electrode
140 intermediate layer
185 hole
186 energy state
190 energy barrier
200 semiconductor superlattice
210 quantum well
220 quantum well
230 energy state
$\Delta E_L$ conduction band discontinuity
$E_F$ Fermi energy
$E_V$ valence band
$E_L$ conduction band
$\Delta W b$ energy band

The invention claimed is:

1. Memory comprising a strained double-heterostructure having an inner semiconductor layer which is sandwiched between two outer semiconductor layers,
   wherein the lattice constant of the inner semiconductor layer differs from the lattice constants of the outer semiconductor layers, the resulting lattice strain in the double-heterostructure inducing the formation of at least one quantum dot inside the inner semiconductor layer, said at least one quantum dot being capable of storing charge carriers therein, and
   wherein, due to the lattice strain, the at least one quantum dot has an emission barrier of 1.15 eV or higher, and provides an energy state density of at least three energy states per 1000 $nm^3$, all said at least three energy states being located in an energy band of 50 meV or less.

2. Memory of claim 1 wherein each of said at least three energy states is capable of storing two charge carriers.

3. Memory of claim 2 wherein each of said at least three energy states stores holes and is capable of storing two holes.

4. Memory of claim 1 wherein said at least three energy states are capable of storing holes, and are energetically located above the Fermi-level if the strained double-heterostructure is unbiased.

5. Memory of claim 1 wherein the memory comprises a 2-dimensional hole gas layer capable of transporting holes for charging or discharging the at least one quantum dot.

6. Memory of claim 5 wherein a semiconductor superlattice is arranged between said 2-dimensional hole gas layer and the at least one quantum dot.

7. Memory of claim 6 wherein said semiconductor superlattice comprises at least two quantum wells, each of which providing at least one energy state.

8. Memory of claim 7 wherein the hole-energy states of the two quantum wells are located above the Fermi-level if the strained double-heterostructure is unbiased.

9. Memory of claim 7 wherein the energetic positions of the energy states of the least two quantum wells differ from another if the strained double-heterostructure is unbiased.

10. Memory of claim 9 wherein the energy states of the least two quantum wells can be shifted relative to each other and relative to the energy states of the at least one quantum dot by applying an external bias voltage to the strained double-heterostructure.

11. Memory of claim 10
    wherein, by applying an erase voltage to the strained double-heterostructure, the energy states of the least two quantum wells can be aligned such that holes can tunnel from the at least one quantum dot through the semiconductor superlattice based on resonant tunneling, and
    wherein, in an unbiased state, the energy levels of the at least two quantum wells mismatch and resonance tunneling of holes is disabled.

12. Memory of claim 11 wherein the 2-dimensional hole gas layer is part of a field effect transistor of the memory, the gate electrode of said field effect transistor allowing to apply a voltage to the strained double-heterostructure.

13. Memory of claim 12 wherein an intermediate layer is arranged between the gate electrode of the field effect transistor and the strained double-heterostructure, said intermediate layer having a smaller band gap than the adjacent outer semiconductor layer of the strained double-heterostructure.

14. Memory of claim 13 characterized by a conduction band discontinuity at the interface between the intermediate layer and the adjacent outer semiconductor layer.

15. Memory of claim 12
    wherein the gate contact of the field effect transistor is an ohmic contact; and
    wherein the intermediate layer is n-doped.

16. Memory of claim 13 wherein the gate contact of the field effect transistor is a Schottky contact.

17. Memory of claim 1 wherein the inner semiconductor layer and the two outer semiconductor layers consist of Ga(As,Sb) and (Al,Ga)As, respectively, or of Ga(As,Sb) and GaP, respectively.

18. Memory of claim 1 wherein the quantum dots in the inner semiconductor layer are arranged in a regular array.

* * * * *